United States Patent
Sato et al.

(10) Patent No.: US 7,700,924 B2
(45) Date of Patent: Apr. 20, 2010

(54) SCINTILLATOR ELEMENT, SCINTILLATOR UNIT, AND RADIATION DETECTOR USING THE SAME

(75) Inventors: Hiroto Sato, Hamamatsu (JP);
Takaharu Suzuki, Hamamatsu (JP);
Kazuaki Okumura, Hamamatsu (JP);
Mayumi Okumura, legal representative, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 558 days.

(21) Appl. No.: 10/548,411

(22) PCT Filed: Mar. 5, 2004

(86) PCT No.: PCT/JP2004/002895

§ 371 (c)(1),
(2), (4) Date: Jan. 2, 2008

(87) PCT Pub. No.: WO2004/081607

PCT Pub. Date: Sep. 23, 2004

(65) Prior Publication Data
US 2008/0217549 A1    Sep. 11, 2008

(30) Foreign Application Priority Data
Mar. 10, 2003    (JP) .............................. 2003-063931

(51) Int. Cl.
*G01T 1/20* (2006.01)
(52) U.S. Cl. ................................. 250/370.11
(58) Field of Classification Search ............ 250/370.01, 250/370.05, 370.09, 370.11; 600/436; 257/E31.129
See application file for complete search history.

(56) References Cited

U.S. PATENT DOCUMENTS

| | | | |
|---|---|---|---|
| 4,945,241 A | 7/1990 | Yamashita et al. | |
| 6,531,225 B1 | 3/2003 | Homme et al. | |
| 6,934,453 B2 * | 8/2005 | Desmone | 385/115 |
| 6,996,209 B2 * | 2/2006 | Marek | 378/98.8 |
| 2002/0168317 A1 * | 11/2002 | Daighighian et al. | 424/1.11 |
| 2009/0101844 A1 * | 4/2009 | Ohbayashi | 250/488.1 |

FOREIGN PATENT DOCUMENTS

| | | |
|---|---|---|
| JP | 54-090089 | 7/1979 |
| JP | 07-311269 | 11/1995 |
| JP | 08-094758 | 4/1996 |
| JP | 09-236669 | 9/1997 |
| JP | 10-307184 | 11/1998 |
| JP | 2000-304865 | 11/2000 |
| JP | 2002-116258 | 4/2002 |
| JP | 2002-341038 | 11/2002 |
| WO | WO 99/66345 | 12/1999 |

* cited by examiner

*Primary Examiner*—David P Porta
*Assistant Examiner*—Faye Boosalis
(74) *Attorney, Agent, or Firm*—Drinker Biddle & Reath LLP

(57) ABSTRACT

A scintillator element 2 has a rod-like base material 11, and a scintillator 12 is formed by being vapor deposited radially onto a side face of the base material 11. A plurality of these scintillator elements 2 are aligned and bundled together to form a scintillator unit 1. By mounting a solid-state image pickup element 20 to an open face of a case 3 of the scintillator unit 1, an image sensor M, which serves as a radiation detector, is formed. The image sensor M can be adjusted in size by adjusting the number, etc., of the scintillator elements 2.

22 Claims, 8 Drawing Sheets

SCINTILLATOR ELEMENT, SCINTILLATOR UNIT, AND RADIATION DETECTOR USING THE SAME

TECHNICAL FIELD

This invention concerns a scintillator element, a scintillator unit, and a radiation detector using the same for use in X-ray image taking for medical and industrial purposes, etc.

BACKGROUND ART

Scintillators, which convert radiation into visible light, are used as radiation detectors in energy discriminators for discriminating X-rays and γ-rays, and image sensors for acquiring radiation images, or the like. As an example of an arrangement using such a scintillator, there is a scintillator panel, described in International Patent Publication No. WO99/66345 Pamphlet (referred to hereinafter as Document 1), wherein a scintillator is formed on a surface of a substrate made of amorphous carbon, etc.

There is also a distribution type detector, which is described in JP 08-94,758A (referred to hereinafter as Document 2) and is formed by bundling together scintillation fibers that are formed of material of the same quality as a scintillator.

DISCLOSURE OF THE INVENTION

However, with the scintillator panel disclosed in Document 1, since the scintillator is formed on the substrate, the shape of the scintillator panel is mostly determined by the shape of the substrate. Thus in order to use such scintillator panels in radiation detectors of various shapes and sizes, etc., scintillator panels of different shapes had to be prepared in accordance to the type of radiation detector, etc. In particular with a scintillator panel to be used in a large product, the substrate needs to be made extremely large and since the scintillator must be formed uniformly on such a large substrate, the scintillator panel is extremely difficult to manufacture. Also, a normal scintillator panel is limited in the thickness of the scintillator and is not suited for high-energy radiation detection, which requires a thick scintillator.

Meanwhile, with the distribution-type detector disclosed in Document 2, scintillator fibers are simply bundled together. Thus this detector's functions cannot be exhibited adequately in application to a radiation detector, etc.

It is an object of the present invention is thus to provide a scintillator element, a scintillator unit, and a radiation detector using the same, which, in application to radiation detectors and other products, can accommodate products of various shapes and sizes and especially products of large size.

In order to achieve the above object, the scintillator element according to the present invention has a scintillator formed by being vapor deposited radially onto a side face of a rod-like member.

To provide a scintillator that can be used in products of various shapes and sizes, it may be considered that a panel, on which a scintillator is to be formed, be simply made compact and a plurality of such panels be arrayed to accommodate for the sizes, etc. of various products. However, even if the panel is made compact, since the panel is plate-like, there is a limit to how compact it can be made.

Meanwhile, with the scintillator element according to the present invention, a scintillator is formed on the side face of a rod-like member. By thus using the rod-like member as a supporting member for forming the scintillator and forming the scintillator on the side face thereof, the scintillator element can be made compact readily. Thus by adjusting the quantity of such scintillator elements to be used, application to image sensors and other products of various shapes and sizes can be carried out favorably. Especially in cases of manufacturing large products, a large product can be manufactured readily by using a large number of the scintillator elements.

Furthermore, since the length of the rod-like member can be set freely, by making the length of the rod-like member long, the thickness of the scintillator can be made thick to enable absorption of high-energy radiation that cannot be absorbed by a normal scintillator panel.

The rod-like member is preferably formed of a material (light transmitting material) that transmits the light emitted from the scintillator.

By the rod-like material being formed of a material that transmits the light emitted from the scintillator, the light emitted from the scintillator is guided through the rod-like member in the direction of, for example, a supporting plate that supports the rod-like member. The light emitted from the scintillator can thus be guided definitely to a desired position.

Glass is preferable as this light transmitting material. By using glass, when the scintillator emits visible light, the converted visible light can be guided definitely and the scintillator can be supported favorably.

A mode wherein the rod-like member is formed of a metal material is also possible. By forming the rod-like member from a metal material, a scintillator element of high strength can be arranged. Also by forming the rod-like member from a metal material, the light emitted from the scintillator can be reflected by the surface of the rod-like member and thereby guided in a desired direction towards a supporting plate, etc.

A mode wherein the rod-like member is formed of a carbon-based material is also possible. By forming the rod-like member from a carbon-based material, obstruction of the entry of X-rays and other radiation can be prevented.

A mode wherein the rod-like member has a cylindrical shape is preferable. By making the rod-like member have a cylindrical shape, a plurality of scintillators can be readily positioned uniformly when the plurality of scintillators are to be arrayed on the same plane. Also in forming the scintillator on the rod-like member, the scintillator can be readily formed uniformly from the surface.

A mode wherein a protective film is formed on the surface of the scintillator is also possible. By forming a protective film on the surface of the scintillator, the scintillator can be protected from physical and chemical damage due to external causes.

In this case, the protective film preferably has a moisture-proof property. A scintillator is generally high in deliquescent property. Though degradation due to attachment of moisture occurs when the deliquescent property is high, by the protective film having a moisture-proof property, contact of the scintillator with moisture can be prevented favorably. Deliquescence of the scintillator can thus be prevented favorably.

A mode wherein a reflecting film is formed on the surface of the scintillator that has been formed on the rod-like member is also preferable. By a reflecting film being formed on the scintillator surface, the light emitted from the scintillator by scintillation emission upon incidence of radiation can be guided definitely to a desired location without leakage to the exterior of the scintillation member and the light amount of the detected light can be made large.

Also in order to achieve the above object, a scintillator unit according to the present invention has a scintillator bundle, formed by bundling together any of the above-described scintillator elements. By thus forming the scintillator unit by bundling together any of the above-described scintillator elements, application to products of various shapes and sizes can be carried out favorably by adjusting the number, etc. of the scintillator elements.

A mode, having a scintillator column, formed by preparing a plurality of any of the above-described scintillator elements and coaxially positioning the respective rod-like members of the plurality of scintillator elements, is also possible. Even in such a mode in which a plurality of the scintillator elements are positioned coaxially, the scintillator elements can be used in accordance to the shape of a product.

A mode, wherein a fixing member is interposed among a plurality of scintillator elements to thereby fix the plurality of scintillator elements, is also possible. By thus interposing a fixing member, such as a resin, among the plurality of scintillator elements and thereby fixing the plurality of scintillator elements, the scintillator elements can be fixed securely.

Also in order to achieve the above object, a radiation detector according to the present invention has a structure that an image pickup element is connected to the rod-like members of the above-described scintillator unit. A mode wherein a photoelectric conversion element is connected to the rod-like members of the above-described scintillator is also possible.

BEST MODES FOR CARRYING OUT THE INVENTION

Figure 1:
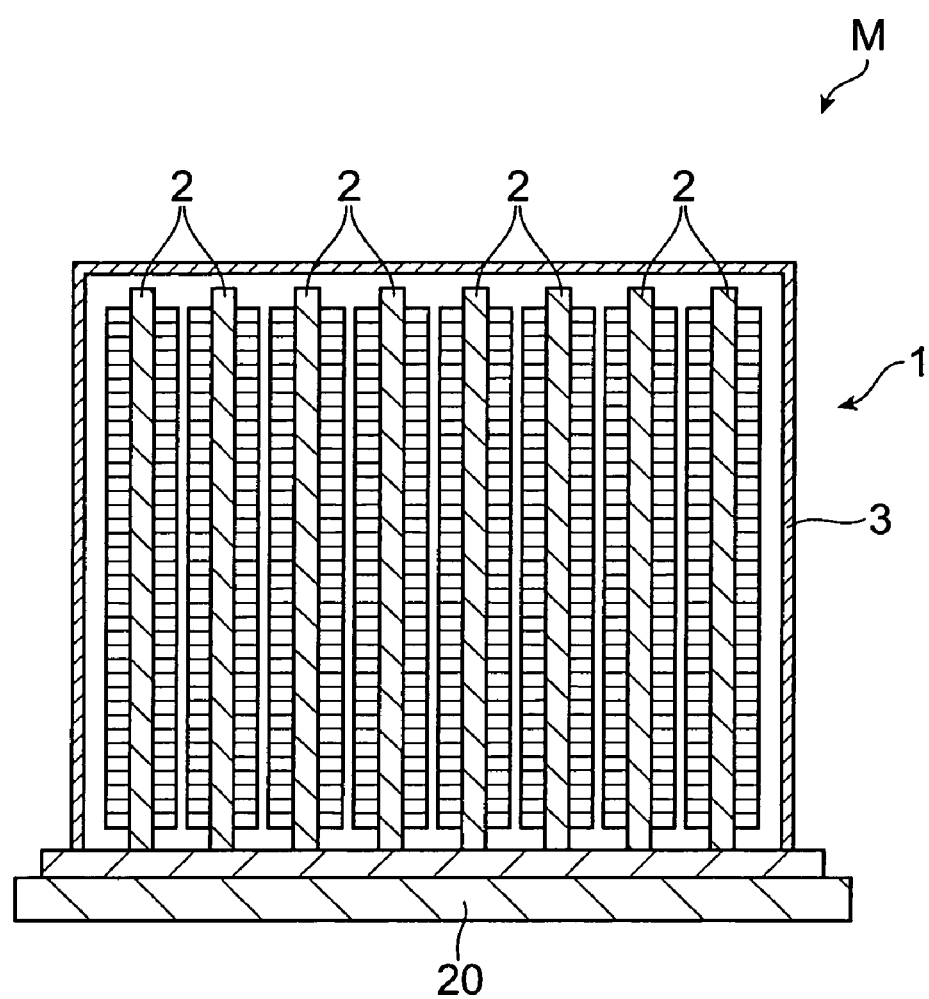
FIG. 1 is a sectional side view of an image sensor provided with a scintillator unit according to the present invention.

Embodiments of the present invention shall now be described specifically with reference to the drawings. To facilitate the comprehension of the explanation, the same reference numerals denote the same parts, where possible, throughout the drawings, and a repeated explanation will be omitted. Also to facilitate the comprehension of the explanation, the respective drawings may have exaggerated or omitted portions and the dimensional proportions thereof are not necessarily in agreement with actuality.

Figure 2:
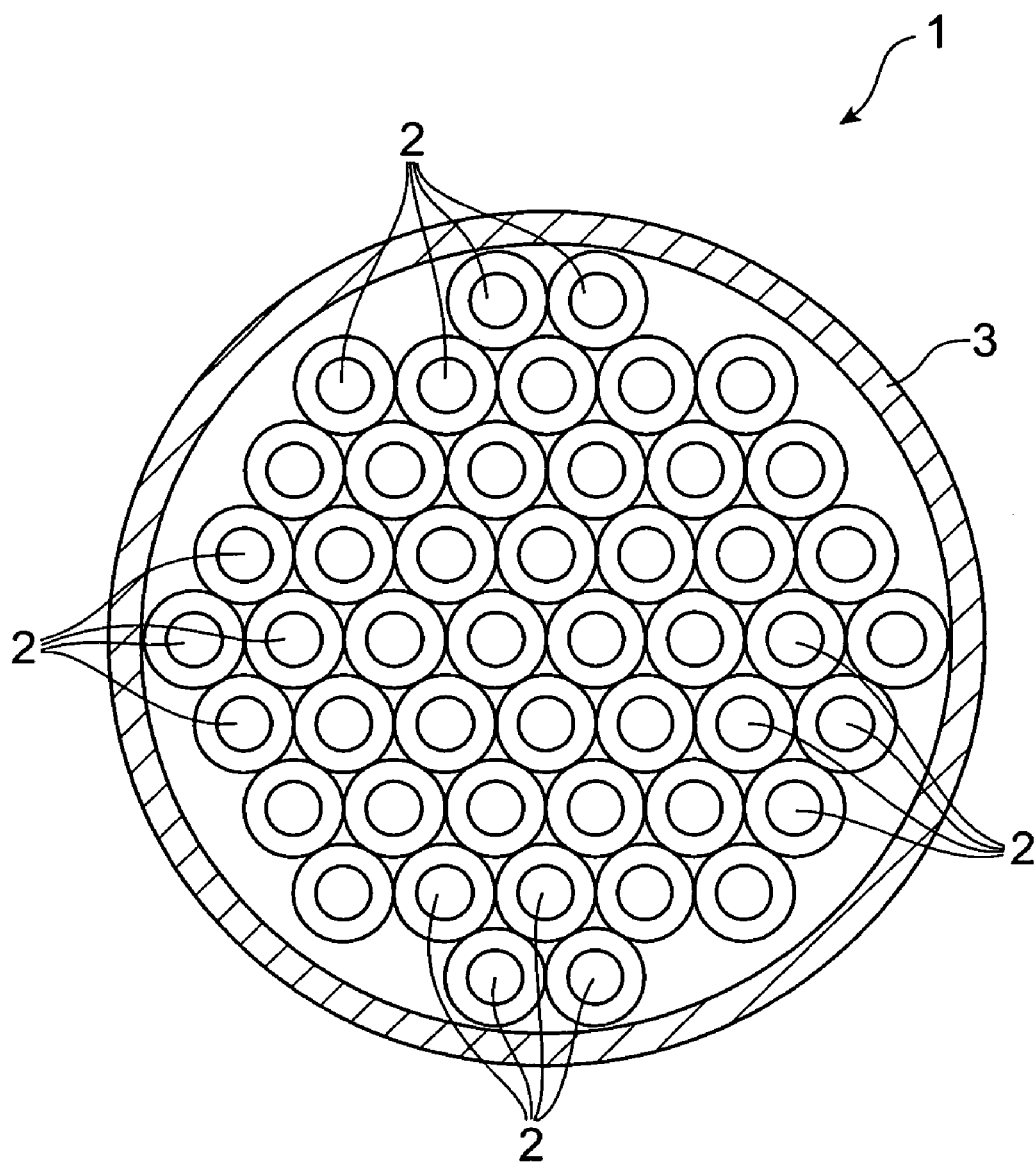
FIG. 2 is a sectional plan view thereof.

FIG. 1 is a sectional side view of an image sensor provided with a scintillator unit of the present embodiment, and FIG. 2 is a sectional plan view of the interior thereof. As shown in FIGS. 1 and 2, the image sensor (radiation detector) M according to the present embodiment has a scintillator unit 1. The scintillator unit 1 has a plurality of scintillator elements 2. As also shown in FIG. 2, the plurality of scintillator elements 2 are positioned in a state wherein the adjacent scintillator elements 2 are in substantially close contact with each other.

Figure 3:
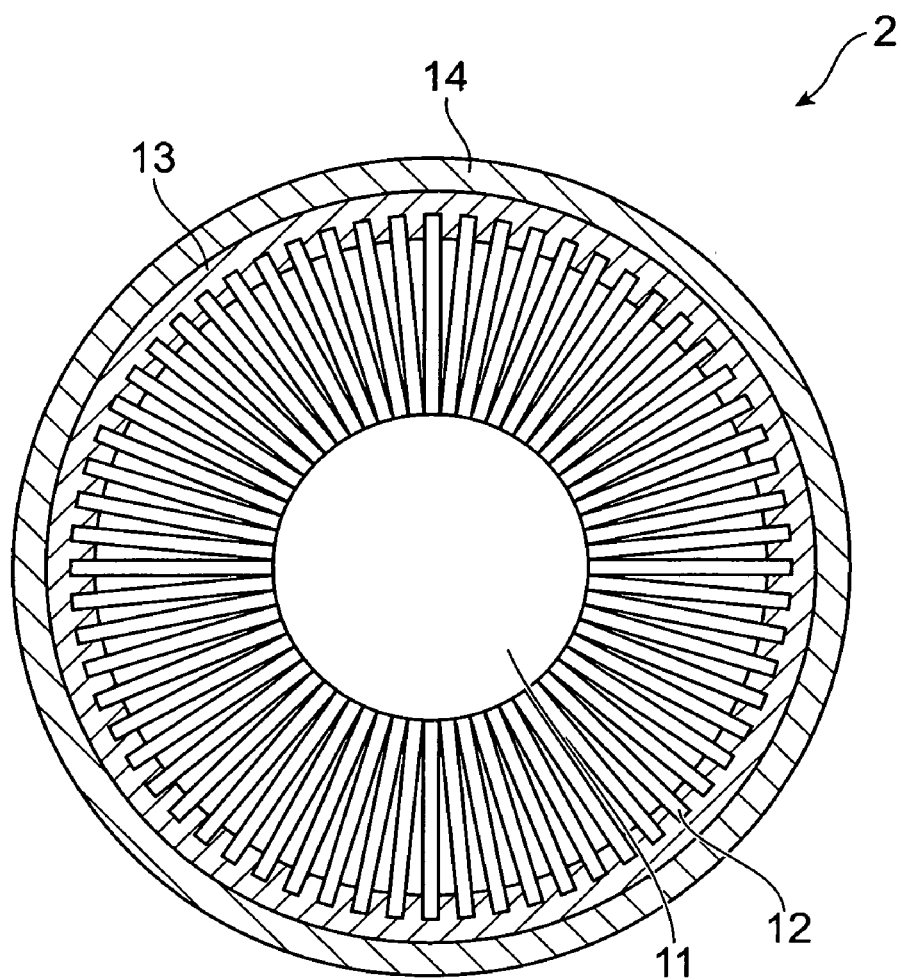
FIG. 3 is a sectional plan view of a scintillator element of the device of FIGS. 1 and 2 and FIG. 4 is a sectional side view thereof.
Figure 4:
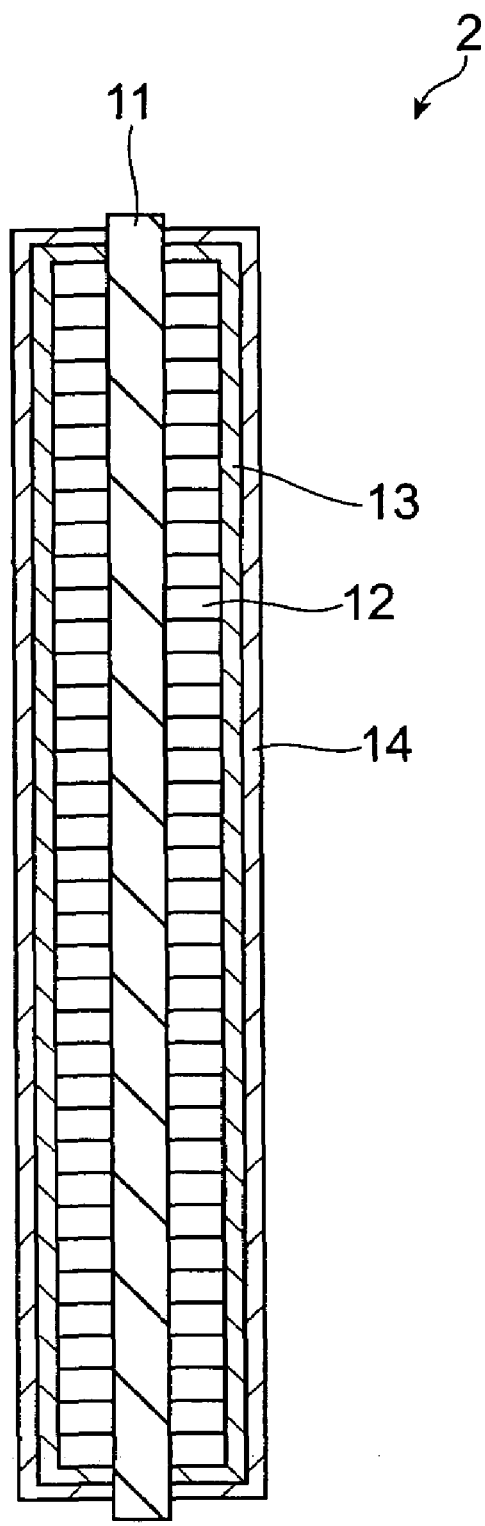

As shown in FIGS. 3 and 4, each scintillator element 2 has a cylindrical base material 11, that is, a rod-like member having a scintillator 12, which converts X-rays, γ-rays, or other radiation to light of a predetermined wavelength, formed radially across the entire circumference of its side face. For example, Tl-doped CsI is used in the scintillator 12, and CsI has a structure wherein a plurality of needle-like crystals (columnar crystals) are bristled together. This scintillator 12 is formed by performing vapor deposition on the circumferential surface of the base material 11. The scintillator 12 of the present embodiment emits visible light upon incidence of X-rays.

The base material 11 is formed of glass, has a radiation transmitting property, and is arranged so that light is propagated through the interior thereof. Besides glass, the base material 11 may be formed of amorphous carbon or other material having carbon as the main component.

Figure 5A:
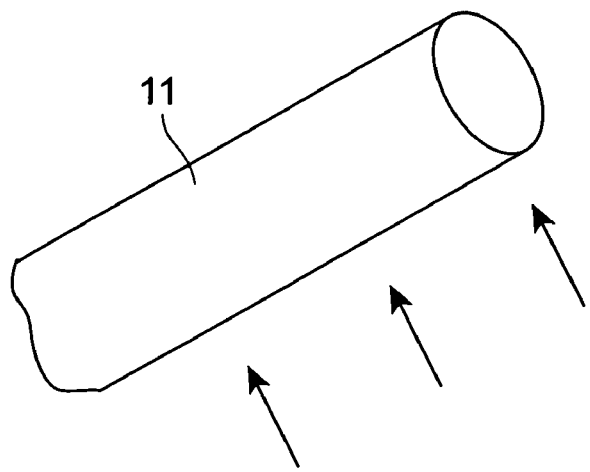
FIGS. 5A to 5C are process diagrams of a manufacturing process of the scintillator element of FIG. 3.
Figure 5B:
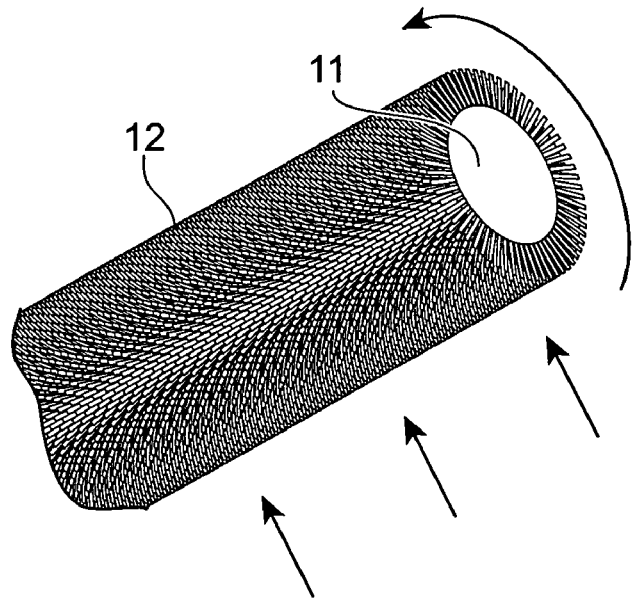
Figure 5C:
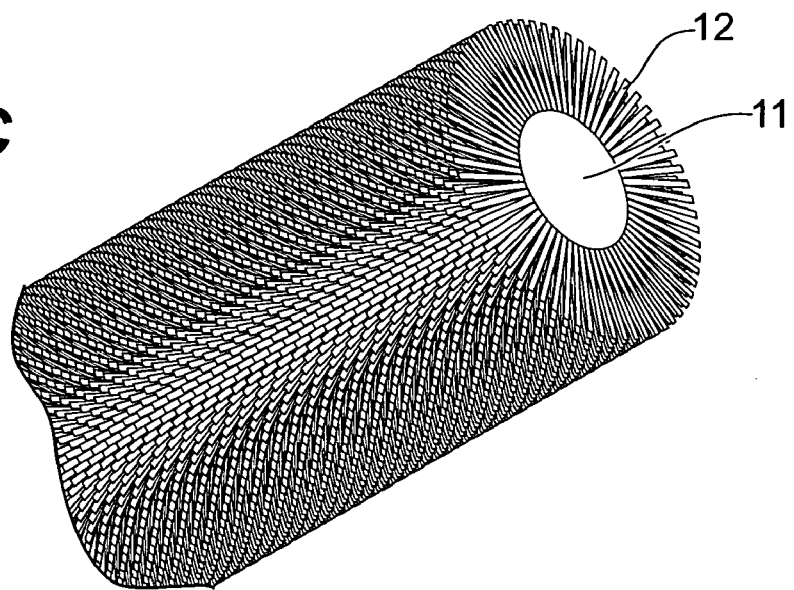

A method of manufacturing the scintillator element 2 shall now be described with reference to FIGS. 5A to 5C. First as shown in FIG. 5A, the base material 11 is prepared and this base material is rotated about its axis. While rotating the base material 11, a scintillator component that is to be the material for forming the scintillator is vapor deposited onto the side face of the base material 11. When the scintillator component is vapor deposited while rotating the base material 11 as it is as shown in FIG. 5B, the scintillator 12 grows gradually on the surface of the base material 11. Then when the scintillator 12 has grown to a desired length as shown in FIG. 5C, the rotation of the base material 11 is stopped and the growth of the scintillator 12 is stopped to complete the scintillator element 2.

A protective film 13 is formed on the surface of the scintillator 12 thus formed on scintillator element 2 and the surface of the scintillator 12 is covered by the protective film 13. The protective film 13 is formed, for example, of polyparaxylylene and prevents physical and chemical damage of the scintillator 12. In particular, by using polyparaxylylene, a high moisture-proof property is exhibited. Though the scintillator 12 used here is high in deliquescent property, the deliquescence of the scintillator 12 is prevented by protection by the high moisture-proof property of the polyparaxylylene. Besides the abovementioned polyparaxylylene, a xylene-based resin, such as polyparachloroxylylene may be used as the protective film 13.

Furthermore, a metal reflecting film 14, to serve as a reflecting film, is formed via the protective film 13 on the surface of the scintillator 12. The metal reflecting film 14 is formed, for example, of aluminum or other metal and covers the surface of the scintillator 12 via the protective film 13, and prevents the visible light emitted from the scintillator 12 from leaking to the exterior of the scintillator 12. The metal reflecting film 14 may be formed of various materials besides the abovementioned aluminum (Al), and a material containing a substance among the group consisting of Ag, Cr, Cu, Ni, Ti, Mg, Rh, Pt, and Au may be used.

As shown in FIGS. 1 and 2, the plurality of these scintillator elements 2 are contained in a case 3, having a lower face that is opened. The case 3 is formed, for example, of a resin having a radiation transmitting property, and a mode is also possible wherein it is formed, for example, of a glass tube or amorphous carbon or other material having carbon as the main component. The plurality of the scintillator elements 2 are fixed and bundled together by a fixing member, formed for example of a transparent resin, and is positioned so as to fill the interior of the case 3 as much as possible. The fixing member is formed, for example, by solidifying molten resin, and the plurality of scintillator elements 2 can be fixed by pouring the resin in the molten state into case 3, immersing the plurality of the scintillator elements 2 in the molten resin, and then cooling and solidifying the resin.

Furthermore, on the open face of the case 3 of the scintillator unit 1 is positioned a solid-state image pickup element 20 that serves as an image pickup element. An end portion of the base material 11 of the scintillator element 2 is connected to the solid-state image pickup element 20, and the solid-state image pickup element 20 receives the light propagated from the scintillator 12 via the base material 11.

The actions of the image sensor of the present embodiment having the above-described arrangement shall now be described.

With image sensor M of the present embodiment, radiation enters from an incidence surface at a position opposite the open face of the case 3. The radiation entered from the incidence surface propagates in straight lines as it is, and is eventually transmitted through the metal reflecting film 14 and the protective film 13, and reaches the scintillator 12 of each scintillator element 2. Upon collision of the radiation with the scintillator 12, the scintillator 12 undergoes scintillation emission and light of a predetermined wavelength (visible light in the present embodiment) is generated from the scintillator 12. The visible light generated from the scintillator 12 is emitted directly toward the base material 11 or the metal reflecting film 14. Here, the visible light emitted directly towards the base material 11 enters as it is into the base material 11, propagates inside the base material 11, and reaches the solid-state image pickup element 20. The visible light directed towards the metal reflecting film 14 is reflected by the metal reflecting film 14 and then eventually enters into the base material 11. The visible light that has thus entered the base material 11 propagates inside the base material 11 and reaches the solid-state image pickup element 20.

The radiation entered from the incidence surface of the case 3 thus propagates in straight lines as it is, is converted into visible light by the scintillator 12 of each scintillator element 2, and is propagated to the solid-state image pickup element 20 via the base material 11. Since a radiation image entered from the incidence surface is thus made visible as it is and reaches the solid-state image pickup element 20 as a visible optical image and since this visible optical image is taken, the function as an image sensor is served.

Here with the image sensor of the present embodiment, a scintillator bundle is formed by bundling together the plurality of the scintillator elements 2. Thus even when, for example, image sensors of different shapes and sizes are to be manufactured, by suitably adjusting the number and manner of bundling together the scintillator elements that form each scintillator bundle, a scintillator bundle, suited to the shape, etc. of the image sensor to be manufactured, can be manufactured readily. Thus regardless of the shape or size of the image sensor, the scintillator element of the present embodiment can be used favorably. Moreover, even when a large image sensor is to be manufactured, the scintillator portion (scintillator unit) to be used in the image sensor can manufactured readily by using a large number of scintillator elements.

Figure 6A:
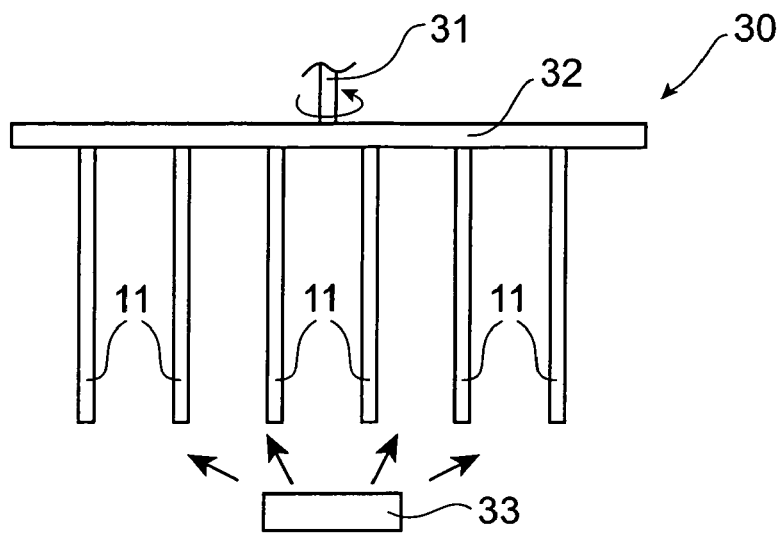
FIGS. 6A to 6C are process diagrams of another manufacturing process of the scintillator elements of FIG. 3.
Figure 6B:
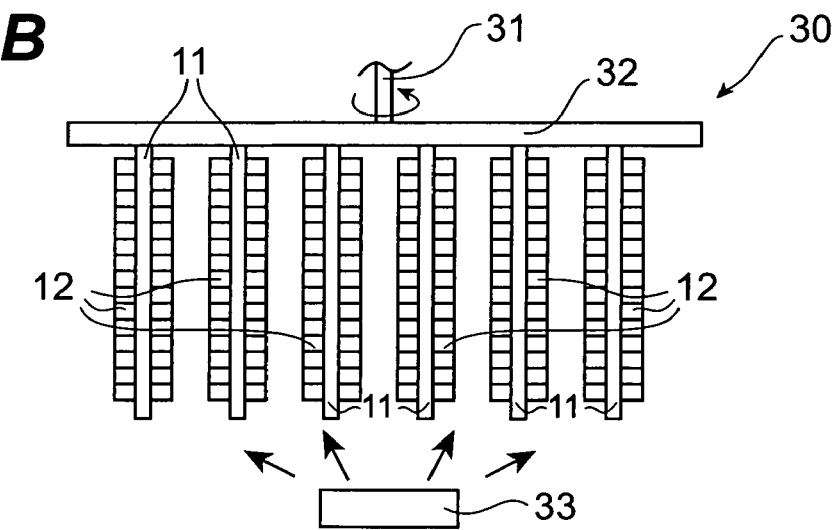
Figure 6C:
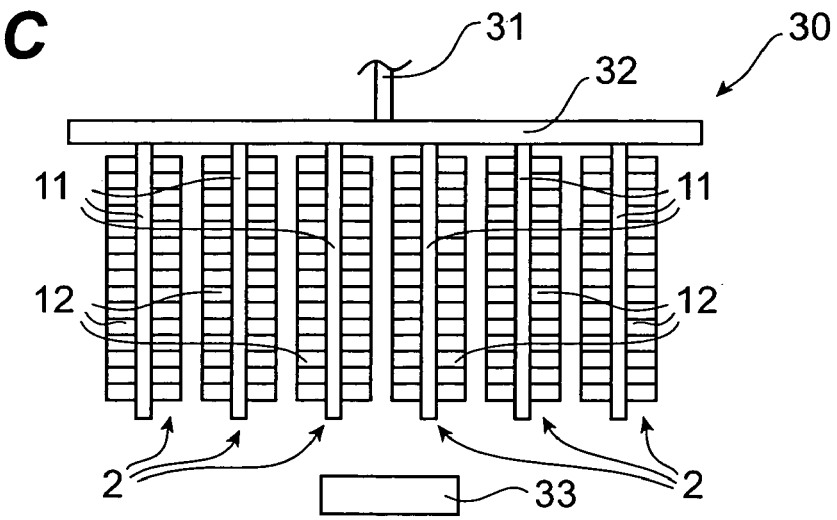

The scintillator elements can also be manufactured as follows. FIGS. 6A to 6C are process diagrams of another manufacturing process of the scintillator elements. As shown in FIG. 6A, in this manufacturing process, a suspending member 30, which can hold a plurality of the base materials 11 in a suspending manner, is used. Here, as base materials 11, glass fibers of 0.5 mm diameter and 100 mm length are used for example.

The suspending member 30 has a rotating shaft 31, which extends in the vertical direction, and a suspending rod 32 is mounted to the rotating shaft 31. A plurality of the base materials 11, that is, the five base materials 11 in the present embodiment are suspended from the suspending rod 32, and by rotation of the rotating shaft 31, the suspending rod 32 rotates about the rotating shaft 31. Also, an evaporator 33, for evaporating scintillator components, is set at a position below the suspending member 30.

In this state, while rotating the suspending rod 32, the scintillator components, comprising, for example, CsI:Tl, is evaporated by means of the evaporator 33. Scintillators are thus gradually grown at the circumferences of the base materials 11 as shown in FIG. 6B. By further evaporating the scintillator components by the evaporator 33 while rotating the suspending rod 32, the scintillators 12 are grown to the desired thickness, for example, 0.5 mm as shown in FIG. 6C. Then after a prescribed annealing step, the scintillator elements 2 are completed. By manufacturing scintillator elements 2 by this method, a large amount of scintillator elements 2 can be manufactured in a short time.

Figure 7:
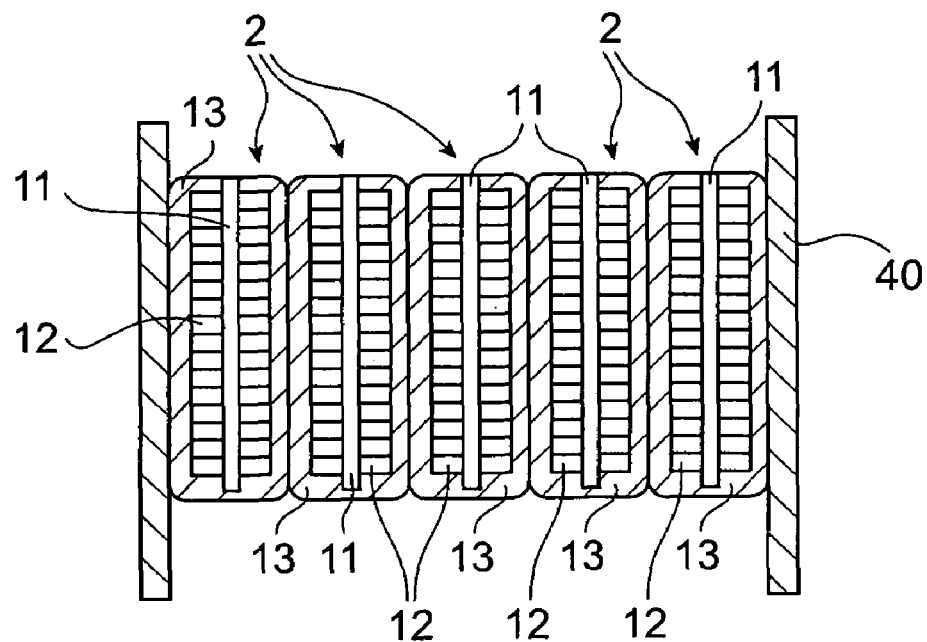
FIG. 7 is a sectional side view showing a state wherein the scintillator elements manufactured by the process of FIGS. 6A to 6C are housed inside a glass tube.
Figure 8:
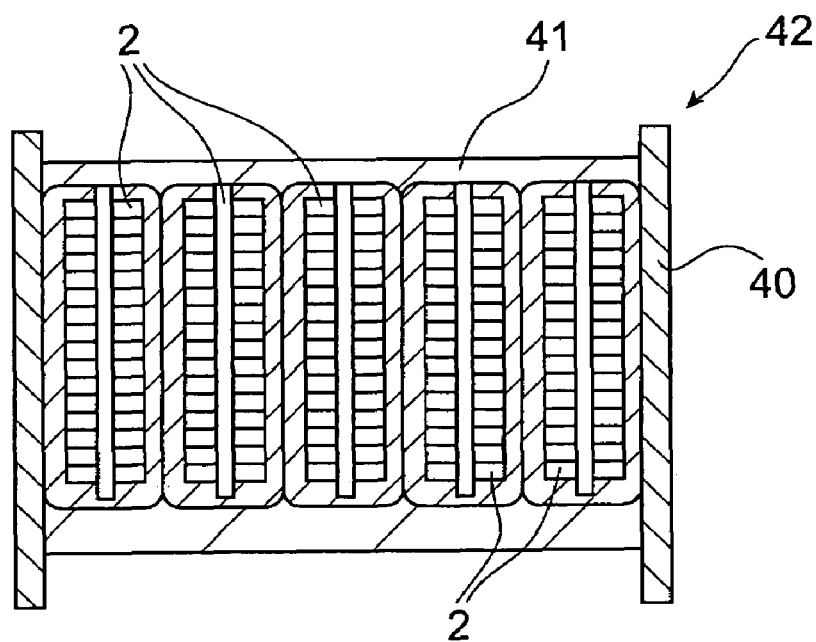
FIG. 8 is a sectional side view of a scintillator base manufactured using the scintillator elements of FIG. 7.
Figure 9:
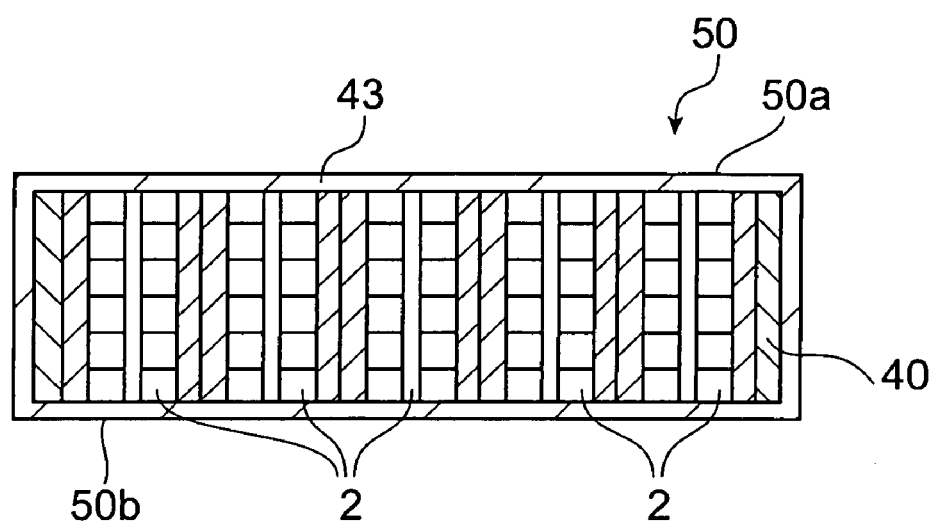
FIG. 9 is a sectional side view of a scintillator unit prepared by cutting the scintillator base of FIG. 8.

Each of the scintillator elements 2, 2 . . . that have thus been manufactured is covered and coated with the protective film 13, formed of the polyparaxylylene. Then as shown in FIG. 7, the plurality of scintillator elements 2 are made to fill and be contained inside a glass tube 40 with gaps being eliminated as much as possible as shown in FIG. 7. Then as shown in FIG. 8, the interior of the glass tube 40 is filled with a transparent resin, which, after being defoamed, is solidified to form a fixing member 41. A scintillator base 42 is thereby manufactured. After the scintillator base 42 has been manufactured, the glass tube 40 and the contents thereof are cut to a length of approximately 20 mm using a thin-blade cutter as shown in FIG. 9. A protective film 43, which protects the cut surface, is then formed by the same procedure as that for forming the protective film on the surfaces of the scintillator elements 2, and a scintillator unit 50 is thereby manufactured. By making radiation enter from the side of one surface 50a that intersects the direction of alignment of the scintillator elements 2 of the scintillator unit 50 and positioning a solid-state image pickup element not shown in the figure at the side of the other surface 50b that opposes the one surface, a radiation detector is arranged. 50a and 50b may be used in a reversed arrangement.

Though preferred embodiments of the present invention have been described above, the present invention is not limited to the above-described embodiments. For example, though with the above-described embodiments, a glass base material is used, other materials with light transmitting properties may be used instead. Also in order to increase the strength of the scintillator element, a metal base material may be used and in order to prevent obstruction of the incidence of radiation, a carbon-based material may be used. In a case where a non-light-transmitting member, such as a metal or carbon, is used in the rod-like members, each scintillator element, which has been formed by performing vapor deposition on the base material, is inserted inside a tubular member of glass or other light transmitting material and the light transmitting tubular member can be used as a light guide for guiding light.

Also with the above-described embodiment, though a cylindrically-shaped base material is used as the rod-like member, this invention is not limited thereto and a base material of, for example, rectangular columnar shape, elliptical columnar shape, etc. may be used. The rod-like member is also not limited to being a columnar body, and for example, a rod-like member of conical shape, rectangular pyramidal shape, or other pyramidal shape or truncated pyramidal shape, or a gourd-like shape, with which a central portion in the height direction is constricted, may be used instead. Also, though with the above-described embodiments, a scintillator bundle is formed by aligning the scintillator elements in directions that intersect (are orthogonal to) the axial direction of the scintillator elements in forming the scintillator unit, a mode wherein the scintillator elements are bundled upon being positioned coaxially is also possible.

Furthermore, though with the above-described embodiments, a scintillator bundle that is fixed directly by a fixing member is contained inside the case 3, a mode wherein, for example, at least one of a protective film or a metal reflecting film or other reflecting film is interposed at the inner side of the case is also possible. In this case, the reflecting film or protective film may be formed by adhesion, etc. on the inner side face of the case 3. Also, though in the above-described embodiments, the scintillator bundle is formed using the fixing member, a mode is also possible wherein the scintillator bundle is formed by fixing the scintillator elements to the case or the solid-state image pickup element.

Meanwhile, though an arrangement wherein a solid-state image pickup element is mounted to the scintillator unit is used as the image sensor, a photoelectric conversion element, such as a photomultiplier tube, may be used instead. In this case, by connecting the photoelectric conversion element to a monitor via a prescribed image processing circuit, the arrangement may be used as an image sensor. Also besides use as an image sensor, the radiation detector may also be used as an energy discriminator.

As described above, according to the present invention, a scintillator element and a scintillator unit can be provided, which, in application to products, such as radiation detectors, can accommodate products of various shapes and sizes and especially products of large size.

Also though in the above-described embodiments, CsI(Tl) is used as the scintillator, this invention is not limited thereto, and, for example, CsI(Na), NaI(Tl), LiI(Eu), Ki(Tl), etc., may be used instead. The scintillator is not limited to a type that emits visible light and may be of a type that emits ultraviolet rays or infrared rays upon incidence of radiation. In this case, an image pickup element with sensitivity to the light resulting from conversion is used, and preferably, the base material that is to serve as an optical guide has a transmitting property for the light resulting from the conversion.

INDUSTRIAL APPLICABILITY

The scintillator element and the scintillator unit according to the present invention can be used favorably for preparing scintillator panels of large area and detectors, such as radiation image sensors, and can also be used favorable for preparing radiation image sensors and radiation detectors of various shapes.

The invention claimed is:

1. A scintillator element comprising:
   a rod-like member; and
   a scintillator vapor deposited onto a side face of the rod-like member having a structure wherein a plurality of needle-like crystals are bristled together, and each of the needle-like crystals is formed radially across the entire circumference of a side face of the rod-like member.

2. The scintillator element according to claim 1, wherein the rod-like member includes a light transmitting material that transmits the light emitted from the scintillator.

3. The scintillator element according to claim 2, wherein the light transmitting material is glass.

4. The scintillator element according to claim 1, wherein the rod-like member includes a metal material.

5. The scintillator element according to claim 1, wherein the rod-like member includes a carbon-base material.

6. The scintillator element according to claim 1, wherein the rod-like member has a cylindrical shape.

7. The scintillator element according to claim 1, having a protective film covering the surface of the scintillator formed on the rod-like member.

8. The scintillator element according to claim 7, wherein the protective film has a moisture-proof property.

9. The scintillator element according to claim 1, having a reflecting film formed on the surface of the scintillator formed on the rod-like member.

10. A scintillator unit comprising:
    a scintillator bundle formed by bundling together a plurality of the scintillator elements according to claim 1.

11. The scintillator unit according to claim 10, further comprising:
    a fixing member, positioned among the plurality of scintillator elements and fixing the plurality of scintillator elements.

12. A radiation detector comprising:
    the scintillator unit according to claim 11; and
    an image pickup element, connected to the rod-like members of the scintillator unit.

13. A radiation detector comprising:
    the scintillator unit according to claim 11; and
    a photoelectric conversion element, connected to the rod-like members of the scintillator unit.

14. A radiation detector comprising:
    the scintillator unit according to claim 10; and
    an image pickup element, connected to the rod-like members of the scintillator unit.

15. A radiation detector comprising:
    the scintillator unit according to claim 10; and
    a photoelectric conversion element, connected to the rod-like members of the scintillator unit.

16. A scintillator unit comprising:
    a scintillator column formed by preparing a plurality of the scintillator elements according to claim 1 and coaxially positioning the respective rod-like members of the plurality of scintillator elements.

17. The scintillator unit according to claim 16, further comprising:
    a fixing member, positioned among the plurality of scintillator elements and fixing the plurality of scintillator elements.

18. A radiation detector comprising:
    the scintillator unit according to claim 16; and
    an image pickup element, connected to the rod-like members of the scintillator unit.

19. A radiation detector comprising:
    the scintillator unit according to claim 16; and
    a photoelectric conversion element, connected to the rod-like members of the scintillator unit.

20. The scintillator element according to claim 1, wherein the rod-like member is a non-light-transmitting member, and further comprising a light transmitting tubular member into which the rod-like-member with the scintillator is inserted.

21. A method of making a scintillator element comprising:
    vapor depositing a scintillator component onto a side face of a rod-like member while rotating the rod-like member about its axis; and
    growing a plurality of needle-like crystals bristled together and formed radially across the entire circumference of a side face of the rod-like member.

22. A method of making a scintillator element comprising:
    vertically suspending a plurality of rod-like members with a suspending member;
    evaporating scintillator components from an evaporator which is set at a position below rod-like members while rotating the suspending member with rod-like members around a vertical axis; and
    growing a plurality of needle-like crystals bristled together and formed radially across the entire circumference of a side face of each of the plurality of rod-like members.

* * * * *